United States Patent
Lee et al.

(10) Patent No.: US 11,917,895 B2
(45) Date of Patent: Feb. 27, 2024

(54) DISPLAY DEVICE INCLUDING GALVANIC REACTION-PATTERNED ELECTRODES, AND METHOD OF MANUFACTURING THE SAME

(71) Applicant: Samsung Display Co., LTD., Yongin-si (KR)

(72) Inventors: Jiyoun Lee, Cheonan-si (KR);
Hyunyoung Kim, Asan-si (KR);
Rohyeon Park, Cheonan-si (KR);
Jong-Ryuk Park, Cheonan-si (KR);
Changwook Kang, Busan-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 18/178,683

(22) Filed: Mar. 6, 2023

(65) Prior Publication Data
US 2023/0209979 A1    Jun. 29, 2023

Related U.S. Application Data

(62) Division of application No. 17/143,338, filed on Jan. 7, 2021, now Pat. No. 11,621,408.

(30) Foreign Application Priority Data

Feb. 28, 2020  (KR) .................. 10-2020-0025434

(51) Int. Cl.
| | |
|---|---|
| *H10K 71/00* | (2023.01) |
| *H10K 50/81* | (2023.01) |
| *H10K 50/82* | (2023.01) |
| *H10K 71/20* | (2023.01) |

(52) U.S. Cl.
CPC ............. *H10K 71/00* (2023.02); *H10K 50/81* (2023.02); *H10K 50/82* (2023.02); *H10K 71/233* (2023.02)

(58) Field of Classification Search
CPC .... H10K 50/81; H10K 50/82; H10K 59/1201; H10K 59/1213; H10K 59/122; H10K 59/123; H10K 59/124; H10K 59/131; H10K 59/1315; H10K 71/00; H10K 71/20;
(Continued)

(56) References Cited

U.S. PATENT DOCUMENTS

2020/0135812 A1*  4/2020  Ohara ............... H10K 50/8445
2021/0043712 A1    2/2021  Kim et al.

FOREIGN PATENT DOCUMENTS

| KR | 1020170079901 A | 7/2017 |
| KR | 101920770 B1 | 11/2018 |

(Continued)

*Primary Examiner* — Matthew E. Gordon
(74) *Attorney, Agent, or Firm* — CANTOR COLBURN LLP

(57) ABSTRACT

A manufacturing method of a display device includes providing a first organic layer in a display area and a non-display area, to cover a pixel electrode and a pad electrode, respectively, providing a first electrode of a light emitting element, in the display area, the first organic layer being between the pixel electrode and the first electrode, after forming the first electrode, removing a portion of the first organic layer which is in the non-display area, to expose the pad electrode from the first organic layer; and providing a light emitting layer of the light emitting element, corresponding to the first electrode.

7 Claims, 15 Drawing Sheets

(58) Field of Classification Search
CPC .... H10K 71/233; H10K 71/40; H10K 71/421; H10K 71/441
USPC .......................................................... 257/79
See application file for complete search history.

(56) References Cited

FOREIGN PATENT DOCUMENTS

| | | | |
|---|---|---|---|
| KR | 1020210018687 A | 2/2021 | |
| KR | 2322700 B1 | 11/2021 | ......... H01L 27/3276 |

* cited by examiner

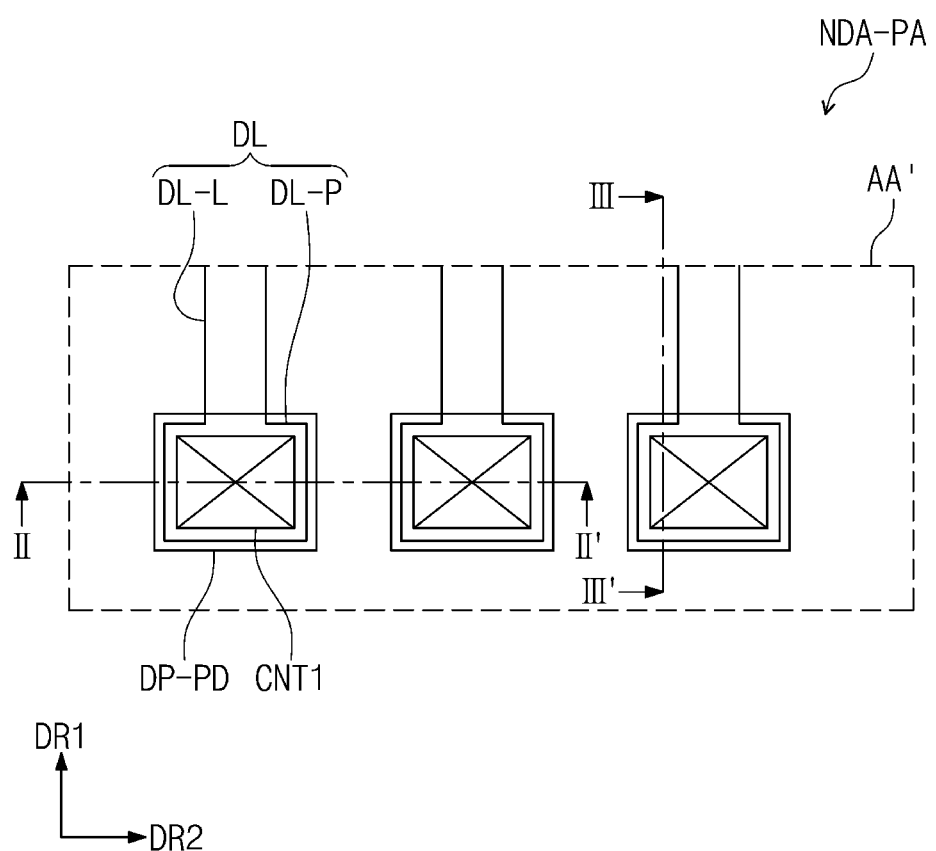

US 11,917,895 B2

DISPLAY DEVICE INCLUDING GALVANIC REACTION-PATTERNED ELECTRODES, AND METHOD OF MANUFACTURING THE SAME

This application is a divisional application of U.S. application Ser. No. 17/143,338 filed Jan. 7, 2021, which claims priority to Korean Patent Application No. 10-2020-0025434, filed on Feb. 28, 2020, and all the benefits accruing therefrom under 35 U.S.C. § 119, the contents of which are hereby incorporated by reference in its entirety.

BACKGROUND

1. Field

Embodiments relate to a display device and a method of manufacturing the same. More particularly, embodiments relate to a display device with reduced defects and a method of manufacturing the display device.

2. Description of the Related Art

Various display devices applied to multimedia devices, such as televisions, mobile phones, tablet computers, navigation devices and game devices, are being developed. The display devices include a keyboard or a mouse as an input device. In addition, the display devices include an input sensor, such as a touch panel, as an input device.

The display devices include a display panel and a circuit board. The display panel is connected to a main board via the circuit board.

SUMMARY

One or more embodiment provides a display device in which defects in a signal pad are reduced.

One or more embodiment provides a method of manufacturing the display device.

An embodiment provides a method of manufacturing a display device including providing a display panel including a display area and a non-display area which is adjacent to the display area, the non-display area including a pad area through which an electrical signal is provided to the display panel from outside thereof and a non-pad area which is between the display area and the pad area; providing a pixel electrode in the display area; providing a pad electrode in the pad area; providing a first organic layer which is in the display area and the non-display area, to cover the pixel electrode and the pad electrode, respectively; providing a first electrode of a light emitting element, in the display area, the first organic layer being between the pixel electrode and the first electrode; after providing the first electrode, removing a portion of the first organic layer which is in the non-display area, to expose the pad electrode from the first organic layer; and providing a light emitting layer of the light emitting element, corresponding to the first electrode.

The providing of the first electrode may include providing a preliminary first electrode layer on the first organic layer, including: a first electrode portion corresponding to the first electrode of the light emitting element, and a peripheral portion surrounding the first electrode portion; providing a photoresist layer covering the preliminary first electrode layer; removing a first portion of the photoresist layer which corresponds to the peripheral portion of the preliminary first electrode layer, to expose the peripheral portion of the preliminary first electrode layer from the photoresist layer and define a second portion of the photoresist layer corresponding to the first electrode portion of the preliminary first electrode layer; removing the peripheral portion of the preliminary first electrode layer to expose a portion of the first organic layer which corresponds to the peripheral portion of the preliminary first electrode layer; and removing the second portion of the photoresist layer to uncover the first electrode portion of the preliminary first electrode layer and define the first electrode therefrom.

The removing the peripheral portion of the preliminary first electrode layer may include wet etching.

The pad electrode may include a side surface, a first pad electrode and a second pad electrode on the first pad electrode. The second pad electrode may include a first metal layer, a second metal layer on the first metal layer, and a third metal layer on the second metal layer, and each of the first metal layer, the second metal layer and the third metal layer may be exposed at the side surface.

At least one of the first metal layer, the second metal layer and the third metal layer may include aluminum.

The second pad electrode may be directly on the first pad electrode.

The removing of the portion of the first organic layer which is in the non-display area may include removing a portion of the first organic layer which is in the non-display area, to provide a second organic layer in the non-display area; and removing a portion of the second organic layer to uncover the pad electrode in the pad area and provide a third organic layer in the non-display area.

The removing of the portion of the first organic layer may include dry etching.

Each of the first organic layer and the second organic layer may have a thickness, and the thickness of the second organic layer may be smaller than the thickness of the first organic layer.

The method may further include providing an insulating layer on which the third organic layer and the pad electrode are disposed. The third organic layer may include a first portion corresponding to the non-pad area of the non-display area, the first portion including a first surface which is furthest from the insulating layer; and a second portion extending from the first portion, through the non-pad area and into the pad area, the second portion including a second surface extending from the first surface of the first portion, toward the pad electrode and to the insulating layer, where the second surface has a concave shape in cross-section.

The first electrode may include silver.

In the providing of the first organic layer which is in the non-display area, the first organic layer may cover an entirety of the pad electrode.

An embodiment provides a display device including a display panel including a display area and a non-display area which is adjacent to the display area, the non-display area including a pad area through which an electrical signal is provided to the display panel from outside thereof and a non-pad area which is between the display area and the pad area, a base member, a first insulating layer on the base member, a pixel electrode in the display area, the pixel electrode facing the base member with the first insulating layer therebetween; a pad electrode in the pad area, the pad electrode facing the base member with the first insulating layer therebetween; and a second insulating layer in the display area and facing the first insulating layer with the pixel electrode therebetween, the second insulating layer extending from the display area and into the non-display area to define a first portion corresponding to the non-pad area, and a second portion extending from the first portion, toward the pad electrode and into the pad area, the second portion defining an upper surface which is furthest from the first insulating layer, where the upper surface has a concave shape in cross-section.

The display device may further include, in the display area, a first electrode of a light emitting element, the first electrode facing the first insulating layer with the second insulating layer therebetween.

Each of the first portion and the second portion of the second insulating layer may have a thickness. The thickness of the second portion of the second insulating layer may be smaller than the first portion of the second insulating layer.

The pixel electrode may be covered by the second insulating layer, and the pad electrode may be exposed from the second insulating layer.

The pixel electrode may include a first pixel electrode and a second pixel electrode which is on the first pixel electrode, and the display panel may further include a third insulating layer between the first pixel electrode and the second pixel electrode.

The pad electrode may include a side surface, a first pad electrode and a second pad electrode which is directly on the first pad electrode, and the second pad electrode may cover the first pad electrode.

The second pad electrode may include a first metal layer, a second metal layer on the first metal layer, and a third metal layer on the second metal layer, and each of the first metal layer, the second metal layer and the third metal layer may be exposed to outside the pad electrode, at the side surface.

At least one of the first metal layer, the second metal layer and the third metal layer may include aluminum, and a remaining one of the first metal layer, the second metal layer and the third metal layer may include titanium.

According to one or more embodiment described above, a defect in which silver ions are discharged around the pad electrode, which is caused by a galvanic reaction between aluminum of the pad electrode and silver of the (first) anode electrode in the non-display area due to a wet etching process in providing of the anode electrode in the display area, may be reduced or effectively prevented.

As an organic layer is provided on the pad electrode of the non-display area to cover and isolate the pad electrode, before the wet etching process, the galvanic reaction between the silver generated during providing of the anode electrode and the aluminum of the pad electrode, may be reduced or effectively prevented.

After the anode electrode is provided, the organic layer covering the pad electrode is removed through a dry etching process. Then, the pad electrode used for attachment of the display panel to a chip-on-film ("COF") in a subsequent module process, may be exposed to outside the organic layer.

BRIEF DESCRIPTION OF THE DRAWINGS

The above and other advantages of the present disclosure will become readily apparent by reference to the following detailed description when considered in conjunction with the accompanying drawings where:

FIG. 5A is a plan view showing an embodiment of a pad area of a display panel;

DETAILED DESCRIPTION

Figure 1:
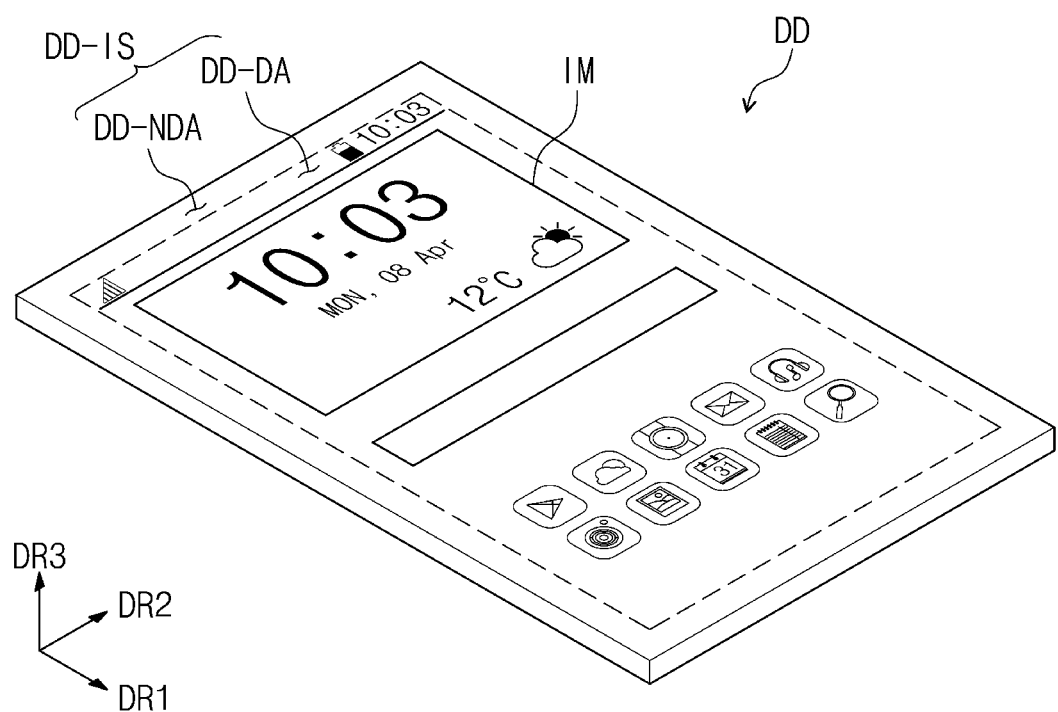
FIG. 1 is a perspective view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the present disclosure, it will be understood that when an element or layer is referred to as being related to another element such as being "on," "connected to" or "coupled to" another element or layer, it can be directly on, connected or coupled to the other element or layer (e.g., no intervening element or layer therebetween) or an intervening element or layer may be present therebetween.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting. As used herein, the singular forms, "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or."

Spatially relative terms, such as "beneath," "below," "lower," "above," "upper" and the like, may be used herein for ease of description to describe one element or feature's relationship to another element(s) or feature(s) as shown in the figures.

It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to accompanying drawings.

Figure 2:
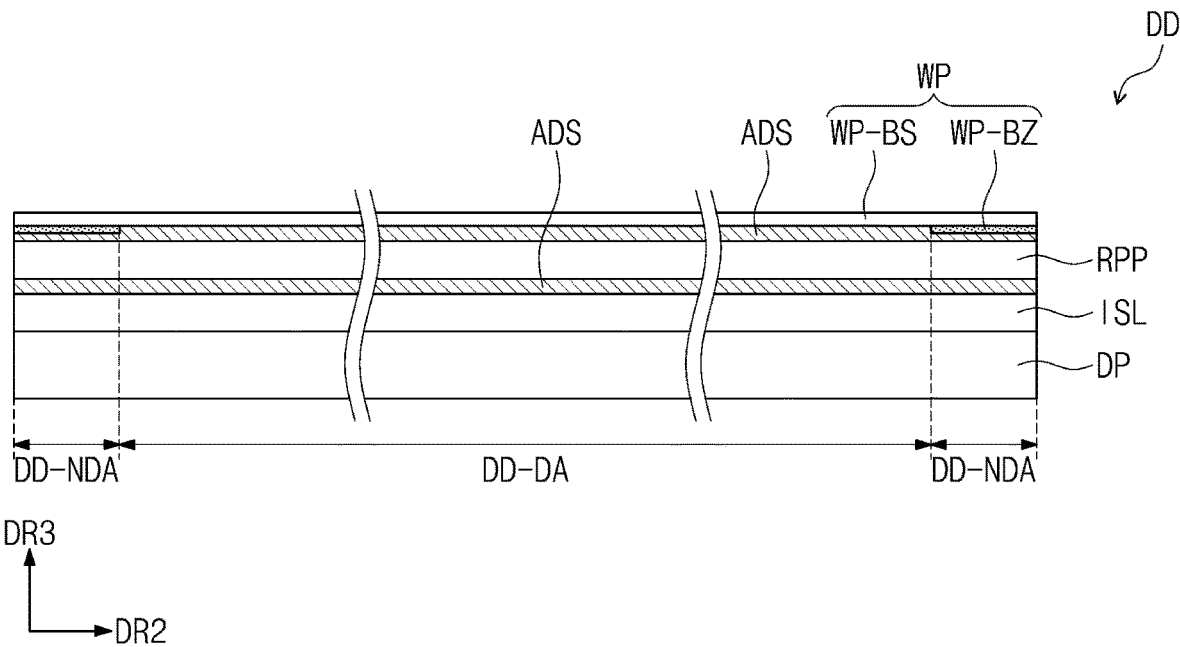
FIG. 2 is a cross-sectional view showing an embodiment of a display device.

FIG. 1 is a perspective view showing an embodiment of a display device DD. FIG. 2 is a cross-sectional view showing an embodiment of the display device DD.

Referring to FIG. 1, the display device DD displays an image IM at or through a display surface DD-IS. The display surface DD-IS is disposed in a plane which is substantially parallel to a plane defined by a first directional axis DR1 (e.g., first direction) and a second directional axis DR2 (e.g., second direction) which cross each other. A third directional axis DR3 (e.g., third direction) indicates a line direction of the display surface DD-IS which is normal to the plane defined by the first directional axis DR1 and the second directional axis DR2, e.g., a thickness direction of the display device DD and/or various components thereof.

Front (or upper) and rear (or lower) surfaces of each member or each unit described below are distinguished from each other along the third directional axis DR3. However, the first, second and third directional axes DR1, DR2 and DR3 are merely exemplary. Hereinafter, first, second and third directions respectively correspond to directions indicated by the first, second and third directional axes DR1, DR2 and DR3 and are assigned with the same reference numerals as the first, second and third directional axes DR1, DR2 and DR3.

In an embodiment, the display device DD includes a flat display surface, however, should not be limited thereto or thereby. The display device DD may further include a curved display surface. The display device DD may include a three-dimensional display surface. The three-dimensional display surface may include a plurality of display areas facing different directions from each other. In an embodiment, for example, a three-dimensional display surface may have a polygonal column-shaped display surface.

The display device DD may be a rigid display device, however, should not be limited thereto or thereby. The display device DD may be a flexible display device. The flexible display device may include a foldable display device or a bendable display device that is rollable, bendable, foldable, etc.

The display device DD that may be applied to a mobile phone terminal is shown as a representative example. Although not shown in figures, electronic modules, a camera module and a power module, which are mounted on a main board, may be placed on a bracket or a case within the display device DD to form the mobile phone terminal. The display device DD may be applied to a large-sized electronic device, such as a television set and a display monitor, and a small and medium-sized electronic device, such as a tablet computer, a car navigation unit, a game unit and a smart watch.

As shown in FIG. 1, the display surface DD-IS includes an image area DD-DA through which the image IM is displayed and a bezel area DD-NDA which is adjacent to the image area DD-DA. The image IM is not displayed through the bezel area DD-NDA. FIG. 1 shows an icon as a representative example of the image IM. The display device DD and various components thereof may include an image area DD-DA and a bezel area DD-NDA corresponding to those described above for the display surface DD-IS.

As shown in FIG. 1, the image area DD-DA may have a substantially quadrangular shape. The expression "substantially quadrangular shape" may mean not only a mathematically defined quadrangular shape but also a quadrangular shape in which a curved line boundary is defined in a vertex area (or a corner area) instead of a vertex.

The bezel area DD-NDA may surround the image area DD-DA, however, should not be limited thereto or thereby. The shape of the image area DD-DA and the shape of the bezel area DD-NDA may be designed in different shapes. The bezel area DD-NDA may be defined only at one side of the image area DD-DA. The bezel area DD-NDA may not be exposed to or visible from outside the display device DD depending on a combination of the display device DD and other components of an electronic device including the display device DD.

FIG. 2 shows a cross-section defined by the second directional axis DR2 and the third directional axis DR3 (e.g., a view along the first directional axis DR1). Components of the display device DD are schematically shown to explain a stacking relationship thereof.

The display device DD may include a display panel DP, an input sensor ISL (e.g., input sensing layer), an anti-reflector RPP (e.g., anti-reflective layer), and a window WP. One of more of the components of the display panel DP, the input sensor ISL, the anti-reflector RPP and the window WP may be provided or formed through successive processes or may be provided or formed separately from each other and subsequently attached to each other by a fixing member such as an adhesive member ADS. The adhesive member ADS may be a transparent adhesive member, such as a pressure sensitive adhesive ("PSA") film, an optically clear adhesive ("OCA") film or an optically clear resin ("OCR"). The adhesive member ADS described hereinafter may include a conventional adhesive or pressure sensitive adhesive. In an embodiment, the anti-reflector RPP and the window WP may be replaced with other components, or may be omitted.

As shown in FIG. 2, among the input sensor ISL, the anti-reflector RPP and the window WP, the input sensor ISL that is provided or formed with the display panel DP through successive processes is disposed directly on the display panel DP. The expression "component B is disposed directly on component A" means that no intervening element or layer, such as a separate adhesive layer or adhesive layer, are present between the component B and the component A. The component B is provided or formed on a base surface defined by the component A, through the successive processes after the component A is provided or formed.

In embodiments, the anti-reflector RPP and the window WP may be a "panel" type component, and the input sensor ISL may be a "layer" type component. The "panel" type component includes a base member providing a base surface, e.g., a synthetic resin film, a composite film or a glass substrate, however, the base member may be omitted from the "layer" type component. In other words, the "layer" type components are disposed on the base surface provided by another component. Referring to FIG. 2, the anti-reflector RPP and the window WP may be the "layer" type component.

The display panel DP generates the image IM, and the input sensor ISL obtains coordinate information of an external input (e.g., touch event, proximity event, pressure event, etc.). Although not shown separately, the display device DD may further include a protective member disposed on a lower surface of the display panel DP. The protective member and the display panel DP may be coupled to each other by the adhesive member ADS.

The display panel DP may be a light emitting type display panel, however, should not be particularly limited. In an embodiment, for instance, the display panel DP may be an organic light emitting display panel or a quantum dot light emitting display panel, distinct from each other depending on a material of a light emitting element LD. A light emitting layer EML of the organic light emitting display panel may include an organic light emitting material. A light emitting layer EML of the quantum dot light emitting display panel may include a quantum dot and/or a quantum rod. Hereinafter, the organic light emitting display panel will be described as a representative example of the display panel DP.

The anti-reflector RPP reduces a reflectance of an external light (e.g., from outside the display device DD) incident thereto from above the window WP (e.g., in a direction opposite to the third directional axis DR3). The anti-reflector RPP may include a retarder and a polarizer. The retarder may be a film type or a liquid crystal coating type and may include a λ/2 retarder and/or a λ/4 retarder. The polarizer may be a film type or a liquid crystal coating type. The film type may include a stretched type synthetic resin film, and the liquid crystal coating type may include liquid crystals arranged in a predetermined arrangement. The polarizer and the retarder may further include a protective film. The retarder and the polarizer or the protective film may be defined as a base member of the anti-reflector RPP.

The anti-reflector RPP may include color filters. The color filters may have a predetermined arrangement. The arrangement of the color filters may be determined by taking into account emission colors of pixels PX included in the display panel DP. The anti-reflector RPP may further include a black matrix disposed adjacent to the color filters.

The anti-reflector RPP may include a destructive interference structure. In an embodiment, for instance, the destructive interference structure may include a first reflection layer and a second reflection layer, which are disposed on different layers from each other. A first reflection light and a second reflection light, which are reflected by the first reflection layer and the second reflection layer, respectively, may be destructively interfered, and thus, the reflectance of the external light may be reduced.

The window WP includes a base layer WP-BS and a light shielding pattern WP-BZ. The base layer WP-BS may include a glass substrate and/or a synthetic resin film. The base layer WP-BS is not be limited to a single-layer structure. The base layer WP-BS may include two or more films or layers coupled to each other by the adhesive member ADS.

The light shielding pattern WP-BZ partially overlaps the base layer WP-BS. The light shielding pattern WP-BZ is disposed on a rear surface of the base layer WP-BS. The light shielding pattern WP-BZ substantially defines the bezel area DD-NDA of the display device DD. That is, along the plane defined by the first directional axis DR1 and the second directional axis DR2, a planar area of the light shielding pattern WP-BZ corresponds to or defines a planar area of the bezel area DD-NDA. A planar area of the window WP in which the light shielding pattern WP-BZ is not disposed may define the image area DD-DA of the display device DD. In the window WP, the planar area in which the light shielding pattern WP-BZ is disposed may be defined as a light shielding area, and the planar area in which the light shielding pattern WP-BZ is not disposed may be defined as a transmission area.

The light shielding pattern WP-BZ may have a multi-layer structure. The multi-layer structure may include a chromatic color layer and an achromatic (e.g., black) light shielding layer. The chromatic color layer and the achromatic light shielding layer may be provided or formed through a deposition, printing or coating process. Although not shown in figures, the window WP may further include a functional coating layer disposed on a front surface of the base layer WP-BS which is opposite to the rear surface thereof. The functional coating layer may include an anti-fingerprint layer, an anti-reflective layer and/or a hard coating layer.

Figure 3:
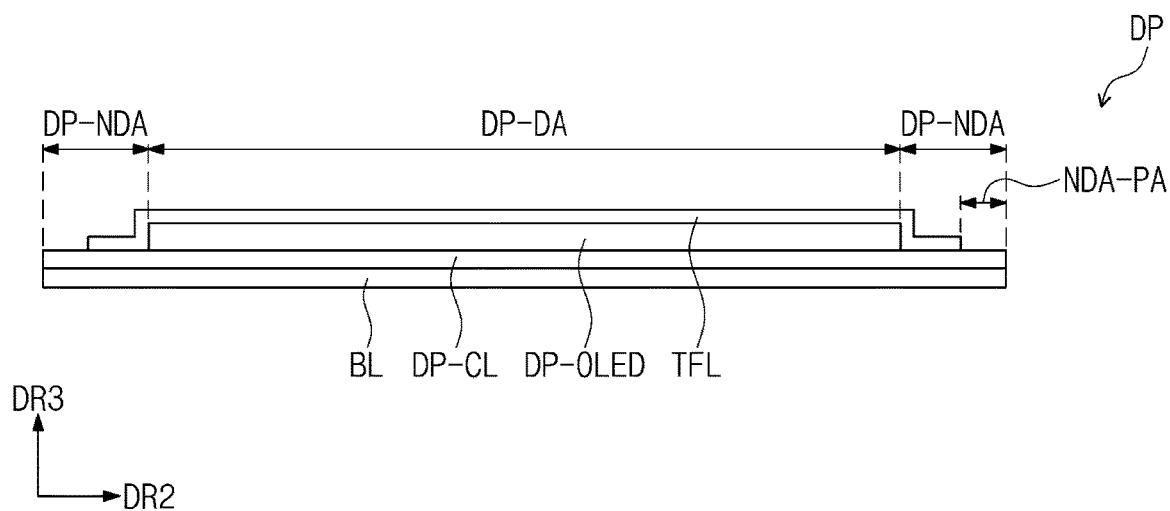
FIG. 3 is a cross-sectional view showing an embodiment of a display panel.

FIG. 3 is a cross-sectional view showing an embodiment of the display panel DP.

Referring to FIG. 3, the display panel DP includes a base layer BL, a circuit element layer DP-CL disposed on the base layer BL, a display element layer DP-OLED, and an upper insulating layer TFL. The display panel DP may include a display area DP-DA and a non-display area DP-NDA, which respectively correspond to the image area DD-DA and the bezel area DD-NDA shown in FIG. 1. The expression "an area/portion corresponds to another area/portion" means that "areas/portions overlap with each other" such as along the third directional axis DR3, but is not limited to "areas/portions have the same size and/or the same shape."

The base layer BL may include at least one synthetic resin film. The base layer BL may include a glass substrate, a metal substrate or an organic/inorganic composite substrate.

The circuit element layer DP-CL includes at least one insulating layer and a circuit element. The insulating layer includes at least one inorganic layer and at least one organic layer. The circuit element includes signal lines and a pixel driving circuit.

The display element layer DP-OLED includes at least organic light emitting diodes as a light emitting element LD. The display element layer DP-OLED may further include an organic layer such as a pixel definition layer PDL.

The upper insulating layer TFL includes a plurality of thin layers. Some thin layers are disposed to improve an optical efficiency, and some thin layers are disposed to protect the organic light emitting diodes.

Figure 4A:
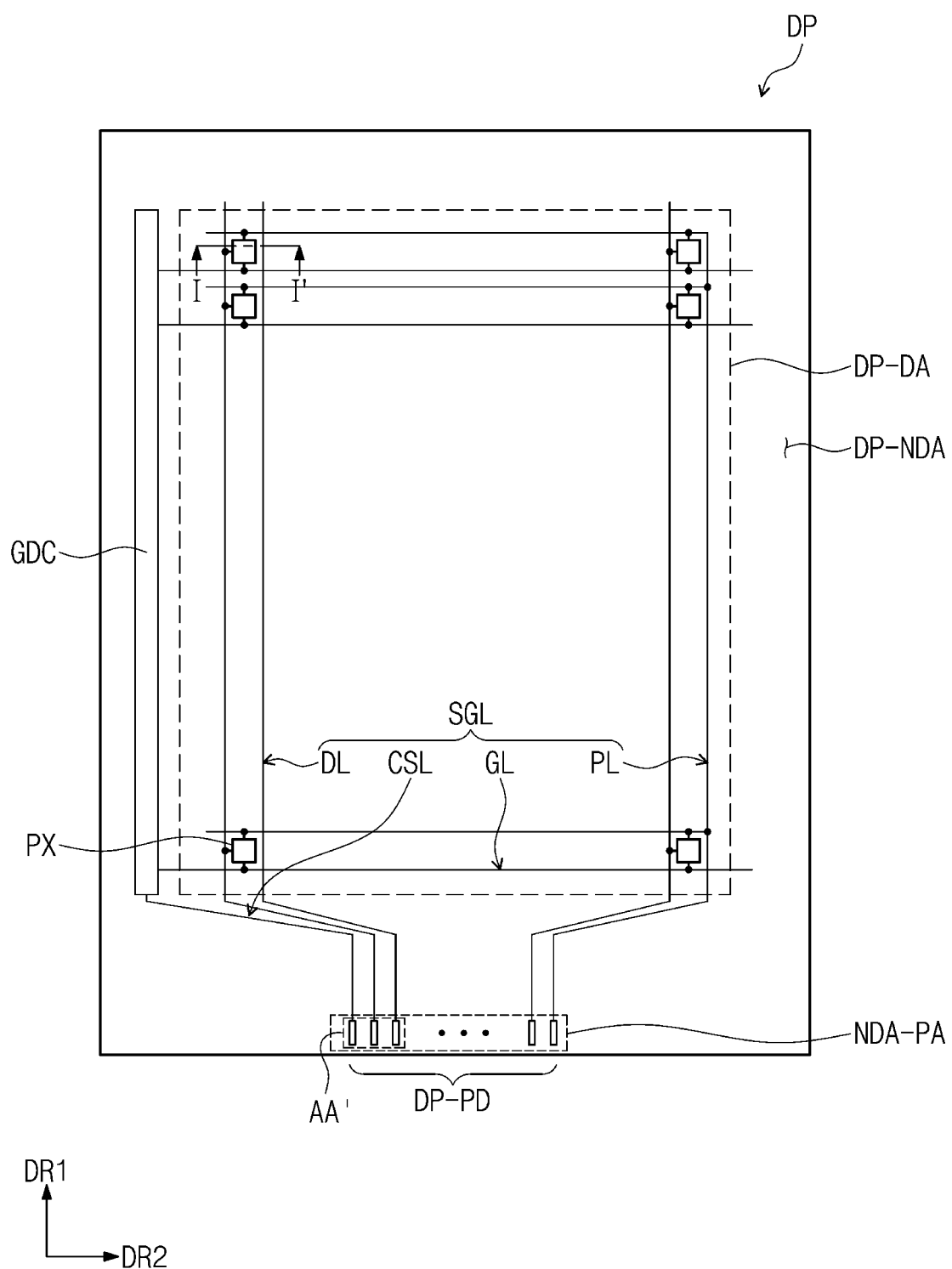
FIG. 4A is a plan view showing an embodiment of a display panel.
Figure 4B:
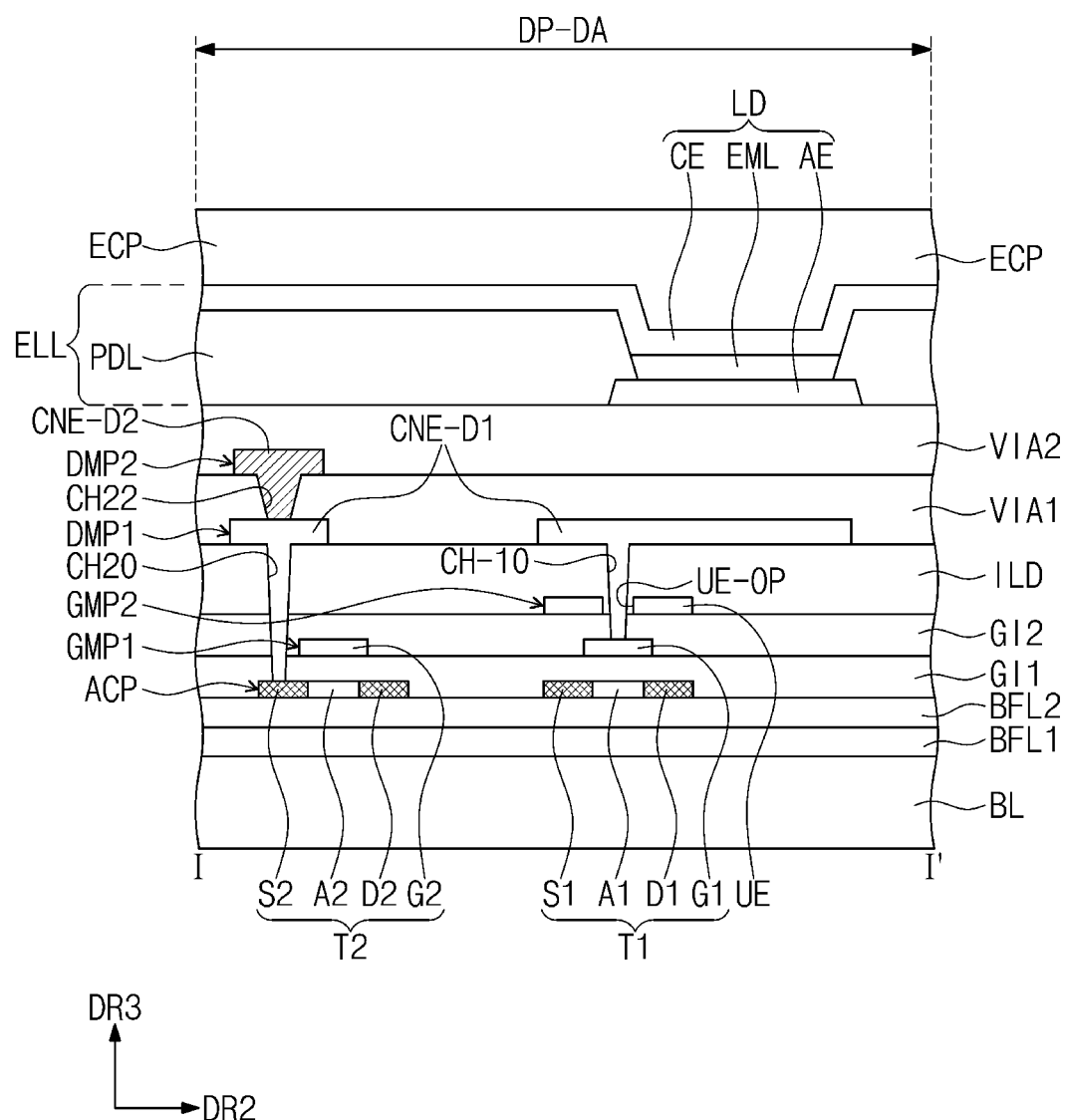
FIG. 4B is a cross-sectional view showing an embodiment of a display panel.

FIG. 4A is a plan view showing an embodiment of the display panel DP, and FIG. 4B is a cross-sectional view of the display panel DP in FIG. 4A.

Referring to FIG. 4A, the display panel DP may include the display area DP-DA and the non-display area DP-NDA in the plan view. In an embodiment, the non-display area DP-NDA may be defined along an edge of the display area DP-DA.

The display panel DP may include a driving circuit GDC, a plurality of signal lines SGL (hereinafter, referred to as "signal lines"), a signal pad DP-PD provided in plural including a plurality of signal pads DP-PD (hereinafter, referred to as "signal pads"), and a pixel PX which is provided in plurality including a plurality of pixels PX (hereinafter, referred to as "pixels"). The pixels PX may be arranged in the display area DP-DA. Each of the pixels PX may include the organic light emitting diode and the pixel driving circuit which is connected to the organic light emitting diode. The driving circuit GDC, the signal lines SGL, the signal pads DP-PD and the pixel driving circuit may be included in the circuit element layer DP-CL shown in FIG. 3.

The driving circuit GDC may include a scan driving circuit. The scan driving circuit may generate a plurality of electrical signals such as scan signals (hereinafter, referred to as "scan signals") and may sequentially output the scan signals to a scan line GL provided in plural including a plurality of scan lines GL (hereinafter, referred to as "scan lines") described later. The scan driving circuit may further output other electrical signals as control signals to the pixel driving circuit of the pixels PX.

The scan driving circuit may include a plurality of thin film transistors provided or formed through the same processes as each other, e.g., a low temperature polycrystalline silicon ("LTPS") process or a low temperature polycrystalline oxide ("LTPO") process, as the pixel driving circuit of the pixels PX.

The signal lines SGL may include the scan lines GL, a data line DL provided in plural including a plurality of data lines DL, a power line PL, and a control signal line CSL provided in plural including a plurality of control signal lines. Each of the scan lines GL may be connected to a corresponding pixel PX among the pixels PX, and each of the data lines DL may be connected to a corresponding pixel PX among the pixels PX. The power line PL may be connected to the pixels PX. The control signal line CSL may provide control signals to the scan driving circuit.

The signal lines SGL may overlap the display area DP-DA and the non-display area DP-NDA. The signal lines SGL may include a pad portion DL-P and a line portion DL-L. The line portion DL-L may overlap the display area DP-DA and the non-display area DP-NDA. The pad portion DL-P may be connected to an end of the line portion DL-L. The pad portion DL-P of the signal lines SGL may be disposed in the non-display area DP-NDA and may overlap a corresponding one of the signal pad DP-PD among the signal pads DP-PD. This will be described in detail later. In the non-display area DP-NDA, an area in which the signal pads DP-PD are disposed may be defined as a pad area NDA-PA. The end of the line portion DL-L of the signal lines SGL may be an end thereof which is furthest from the display area DP-DA, that is, closest to the pad area NDA-PA, without being limited thereto.

The line portion DL-L of the signal line SGL is connected to and extends from the pixel PX. The line portion DL-L may substantially constitute most of the signal lines SGL, e.g., a majority length portion thereof. The line portion DL-L may be connected to the pixel PX at transistors T1 and T2 (refer to FIG. 4B) of the pixel PX. The line portion Dl-L may have a single-layer or multi-layer structure in a thickness direction, and the line portion DL-L may be a single body along a respective length of the signal lines SGL or may include two or more portions along the length of the signal lines SGL. The two or more portions of the signal lines SGL may be disposed on or in different layers among layers on the base layer BL, and may be connected to each other at or through a via (contact) hole defined through an insulating layer disposed between the two or more portions of the signal lines SGL.

FIG. 4B is a cross-sectional view taken along line I-I' of FIG. 4A. FIG. 4B shows the cross-sectional view of the display area DP-DA of the display panel DP. Referring to FIG. 4B, the display panel DP may include a first buffer layer BFL1, a second buffer layer BFL2, a first gate insulating layer GI1, a second gate insulating layer GI2, a first insulating layer ILD, a second insulating layer VIA2, a third insulating layer VIA1, a semiconductor pattern ACP (e.g., semiconductor layer) including a plurality of patterns, a first conductive layer GMP1 including a plurality of patterns (e.g., first conductive patterns), a second conductive layer GMP2 including a plurality of patterns (e.g., second conductive patterns), a third conductive layer DMP1 including a plurality of patterns (e.g., third conductive patterns), and a fourth conductive layer DMP2 including a plurality of patterns (e.g., fourth conductive patterns). The first conductive layer GMP1 may include a first gate metal pattern, the second conductive layer GMP2 may include a second gate metal pattern, the third conductive layer DMP1 may include a first data metal pattern, and the fourth conductive layer DMP2 may include a second data metal pattern.

Each of the first gate insulating layer GI1, the second gate insulating layer GI2 and the first insulating layer ILD may include an organic layer and/or an inorganic layer. In an embodiment, each of the first gate insulating layer GI1, the second gate insulating layer GI2 and the first insulating layer ILD may include a plurality of inorganic thin layers. The inorganic thin layers may include a silicon nitride layer and a silicon oxide layer.

Each of the second insulating layer VIA2 and the third insulating layer VIA1 may include an organic material and/or an inorganic material. In an embodiment, each of the first conductive layer GMP1 and the second conductive layer GMP2 may include molybdenum (Mo), however, should not be limited thereto or thereby.

Each of the third conductive layer DMP1 and the fourth conductive layer DMP2 may include at least one material among aluminum (Al) and titanium (Ti), however, should not be limited thereto or thereby. In an embodiment, each of the third conductive layer DMP1 and the fourth conductive layer DMP2 may have a structure in which titanium, aluminum and titanium are sequentially stacked.

The first buffer layer BFL1 may be disposed on the base layer BL. The second buffer layer BFL2 may be disposed on the first buffer layer BFL1. That is, the second buffer layer BFL2 may face the base layer BL with the first buffer layer BFL1 therebetween. Each of the first buffer layer BFL1 and the second buffer layer BFL2 may reduce or effectively prevent entry of a foreign substance existing in the base layer BL to the pixel PX. In particular, each of the first buffer layer BFL1 and the second buffer layer BFL2 may reduce or effectively prevent the foreign substance from entering the semiconductor pattern ACP of the transistors T1 and T2 within the pixel PX.

The foreign substance may be introduced from outside the display device DD and/or may be generated by thermal decomposition of the base layer BL within the display device DD. The foreign substance may be gas or sodium discharged from the base layer BL. In addition, each of the first buffer layer BFL1 and the second buffer layer BFL2 may block moisture from entering the pixel PX from outside thereof. According to another embodiment, at least one of the first buffer layer BFL1 and the second buffer layer BFL2 may be omitted.

The semiconductor pattern ACP may be disposed on the second buffer layer BFL2. The semiconductor pattern ACP may form a portion of each of the transistors T1 and T2. The semiconductor pattern ACP may include polysilicon, amorphous silicon or metal oxide semiconductor. FIG. 4B shows a semiconductor pattern ACP providing or forming a first source region S1, a first active region A1, and a first drain region D1 of a first transistor T1 among the transistors T1 and T2, and a semiconductor pattern ACP providing or forming a second source region S2, a second active region A2, and a second drain region D2 of a second transistor T2 among the transistors T1 and T2.

The first gate insulating layer GI1 may be disposed on the second buffer layer BFL2 and may cover the semiconductor pattern ACP. The first conductive layer GMP1 may be disposed on the first gate insulating layer GI1. A first gate G1 (e.g., first gate electrode or first gate terminal) of the first transistor T1 and a second gate G2 (e.g., second gate electrode or second gate terminal) of the second transistor T2 are shown as the first conductive layer GMP1. Although not shown in figures, the first conductive layer GMP1 may include one electrode of two electrodes that form a capacitor of the pixel PX.

The second gate insulating layer GI2 may be disposed on the first gate insulating layer GI1 and may cover the first conductive layer GMP1. The second conductive layer GMP2 may be disposed on the second gate insulating layer GI2. In an embodiment, the second conductive layer GMP2 may be the other electrode of the two electrodes that form the capacitor of the pixel PX. An upper electrode UE is shown as the second conductive layer GMP2. The upper electrode UE may be provided with a first opening UE-OP defined therethrough.

The first insulating layer ILD may be disposed on the second gate insulating layer GI2 and may cover the second conductive layer GMP2. The third conductive layer DMP1 may be disposed on the first insulating layer ILD. Two first connection electrodes CNE-D1 are shown as a representative example of the third conductive layer DMP1. The first connection electrodes CNE-D1 of the third conductive layer DMP1 may be connected to the first gate G1 of the first transistor T1 and the second source region S2 of the second transistor T2 at a first via hole CH-10 and a second via hole CH20, respectively.

The third insulating layer VIA1 may be disposed on the first insulating layer ILD and may cover the third conductive layer DMP1. The fourth conductive layer DMP2 may be disposed on the third insulating layer VIA1. One of a second connection electrode CNE-D2 is shown as a representative example of the fourth conductive layer DMP2. The second connection electrode CNE-D2 may be connected to a corresponding one of the first connection electrode CNE-D1 through a connection contact hole CH22 (e.g., first contact hole) defined through the third insulating layer VIA1. Since the first connection electrodes CNE-D1 and the second connection electrode CNE-D2 are disposed in the display area DP-DA in which the pixels PX are arranged, the first connection electrodes CNE-D1 and the second connection electrode CNE-D2 may be defined as and hereinafter referred to as a first pixel electrode CNE-D1 and a second pixel electrode CNE-D2, respectively. The first and second pixel electrodes CNE-D1 and CNE-D2 may collectively form a pixel electrode. The first and second pixel electrodes CNE-D1 and CNE-D2 may be disposed on the first insulating layer ILD. In detail, the first pixel electrode CNE-D1 may be disposed directly on the first insulating layer ILD, and the second pixel electrode CNE-D2 may be disposed on the third insulating layer VIA1.

In FIG. 4B, the second insulating layer VIA2 may be disposed on the third insulating layer VIA1 and may cover the fourth conductive layer DMP2 in the display area DP-DA. A light emitting element layer ELL may include a light emitting element LD and a planarization layer PDL. The light emitting element LD may include an anode electrode AE (e.g., first electrode), a light emitting layer EML, and a cathode electrode CE (e.g., second electrode). The planarization layer PDL may correspond to and be hereinafter referred to as a pixel definition layer PDL. The anode electrode AE may be disposed in an anode layer AEL (e.g., first electrode layer). The second insulating layer VIA2 may be disposed on the third insulating layer VIA1.

The anode layer AEL may be disposed on the second insulating layer VIA2. The anode electrode AE may be electrically connected to the fourth conductive layer DMP2 through a via (contact) hole (not shown). The pixel definition layer PDL may be disposed on the second insulating layer VIA2, and at least a portion of the anode electrode AE may be exposed through the pixel definition layer PDL. The light emitting layer EML may be disposed on the anode electrode AE. The cathode electrode CE may be disposed on the light emitting layer EML.

Where the light emitting element LD is the organic light emitting diode, the light emitting layer EML may include an organic material. According to another embodiment, where the light emitting element LD is a micro-light emitting diode (e.g., micro-LED), the light emitting layer EML may include an inorganic material. An encapsulation layer ECP may encapsulate the light emitting element layer ELL on the base layer BL, to protect the light emitting element layer ELL from external oxygen or moisture. The encapsulation layer ECP may have a structure in which an organic layer and an inorganic layer are provided together with each other. The encapsulation layer ECP may correspond to the upper insulating layer TFL of FIG. 3.

Figure 5B:
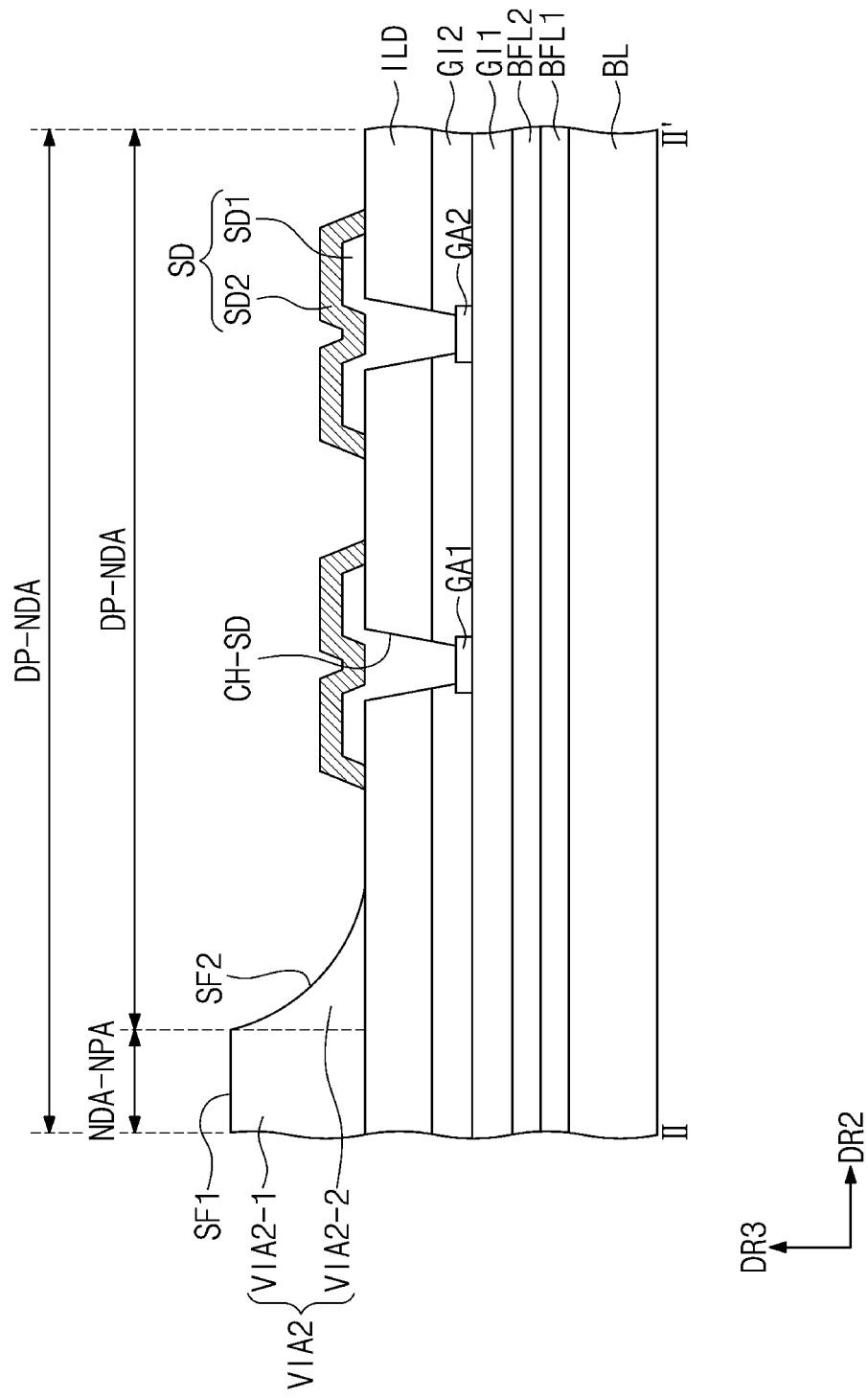
FIG. 5B is a cross-sectional view showing an embodiment of a pad area of a display panel.

FIG. 5A is a plan view showing an embodiment of the pad area NDA-PA of the display panel DP, and FIG. 5B is a cross-sectional view showing an embodiment to the pad area NDA-PA of the display panel DP in FIG. 5A.

FIG. 5A is an enlarged plan view of the pad area NDA-PA of the display panel DP and shows an area AA' of FIG. 4A. A signal line and a signal pad DP-PD which corresponds to the signal line are electrically connected to each other through a via (contact) hole defined through at least one encapsulation inorganic layer that entirely overlaps the display area DP-DA and the non-display area DP-NDA. Hereinafter, this will be described in more detail with reference to figures.

In FIG. 5A, the signal pad DP-PD may include a line portion DL-L provided in plural including line portions DL-L and a pad portion DL-P provided in plural including pad portions DL-P of the data lines DL. The data lines DL may include a length defined from the display area DP-DA to the pad area NDA-PA. For a same length of the data lines DL, the pad portions DL-P may have a larger planar area than a planar area of the line portions DL-L. The line portions DL-L and the pad portions DL-P may be electrically connected to each other at or through a pad contact hole CNT1 (e.g., second contact hole). The pad portions DL-P may have a quadrangular shape in the plan view, however, the shape of the pad portions DL-P may be changed such as during a manufacturing process. According to an embodiment, the signal pads DP-PD may include a pad electrode SD provided in plural including a plurality of pad electrodes SD (refer to FIG. 5B).

FIG. 5B is a cross-sectional view taken along line II-II' of FIG. 5A. FIG. 5B shows the non-display area DP-NDA of the display panel DP. In detail, FIG. 5B shows the pad area NDA-PA and a non-pad area NDA-NPA, which are defined in the non-display area DP-NDA. The pad area NDA-PA is a planar area of the non-display area DP-NDA in which the pad electrodes SD are disposed, and the non-pad area NDA-NPA is a planar area of the non-display area DP-NDA in which the pad electrodes SD are not disposed. In an embodiment, the non-display area DP-NDA includes the pad area NDA-PA through which an electrical signal is provided to the display panel DP from outside thereof and the non-pad area NDA-NPA which is between the display area DP-DA and the pad area NDA-PA. In the display area DP-DA (FIG. 4B), the pixel electrode is covered by the second insulating layer VIA2, and in the pad area NDA-PA (FIG. 5B), the pad electrode SD is exposed outside of the second insulating layer VIA2.

In FIG. 5B, the pad electrodes SD may include a first pad electrode SD1 (e.g., first pad electrode layer or first pad electrode pattern) and a second pad electrode SD2 (e.g., second pad electrode layer or second pad electrode pattern). The pad electrodes SD may be disposed on the first insulating layer ILD. The second pad electrode SD2 is closer to the first organic layer VIA21 than the first pad electrode SD1. The second pad electrode SD2 may be disposed directly on the first pad electrode SD1. The second pad electrode SD2 may form an interface with the first pad electrode SD1. The first pad electrode SD1 may be electrically connected to a first gate pattern GA1 or a second gate pattern GA2 disposed on the first gate insulating layer GI1 through a pad electrode contact hole CH-SD (e.g., third contact hole).

The pad electrodes SD may overlap or correspond to the pad area NDA-PA. The second pad electrode SD2 may be disposed to be exposed to outside the display panel DP. Thus, the second pad electrode SD2 may be attached to a chip-on-film ("COF") or cyclo olefin polymer (COP) film in a module process of manufacturing a display device DD. The second insulating layer VIA2 may be disposed on the first insulating layer ILD in the non-display area DP-NDA, to form an interface therebetween. That is, the third insulating layer VIA1 may not be disposed between the first insulating layer ILD and the second insulating layer VIA2, in the non-display area DP-NDA. Most of the second insulating layer VIA2 may overlap or correspond to the non-pad area NDA-NPA, and a portion of the second insulating layer VIA2 may overlap or correspond to the pad area NDA-PA. This will be described in detail with reference to FIGS. 6A to 6I.

The second insulating layer VIA2 may include a first portion VIA2-1 and a second portion VIA2-2. A portion of the second insulating layer VIA2 which overlaps or corresponds to the non-pad area NDA-NPA of the non-display area DP-NDA, may correspond to the first portion VIA2-1, and a portion of the second insulating layer VIA2 which overlaps or corresponds to the pad area NDA-PA of the non-display area DP-NDA, may correspond to the second portion VIA2-2. The second insulating layer VIA2 in the non-pad area NDA-NPA of the non-display area DP-NDA extends to the pad area NDA-PA to define an extended portion of the second insulating layer VIA2 as the second portion VIA2-2. The second portion VIA2-2 may extend along the first insulating layer ILD to a center of the pad area NDA-PA from the first portion VIA2-1, and may partially overlap an edge of the pad area NDA-PA. The edge of the pad area NDA-PA may be a boundary defined between the non-pad area NDA-NPA and the pad area NDA-PA. The first insulating layer ILD may be exposed to outside the second insulating layer VIA2, at the pad area NDA-PA.

The first portion VIA2-1 of the second insulating layer VIA2 may include a first surface SF1 which is furthest from the first insulating layer ILD, and the second portion VIA2-2 may include a second surface SF2 which is furthest from the first insulating layer ILD and inclinedly extending from the first surface SF1 to the first insulating layer ILD along the thickness direction. The first surface SF1 may be flat. The second surface SF2 may be curved to be concave in the thickness direction of the first insulating layer ILD. That is, the second surface SF2 has a concave shape in cross-section.

FIGS. 6A to 6I are cross-sectional views showing an embodiment of a method of manufacturing a display device DD.

Figure 6A:
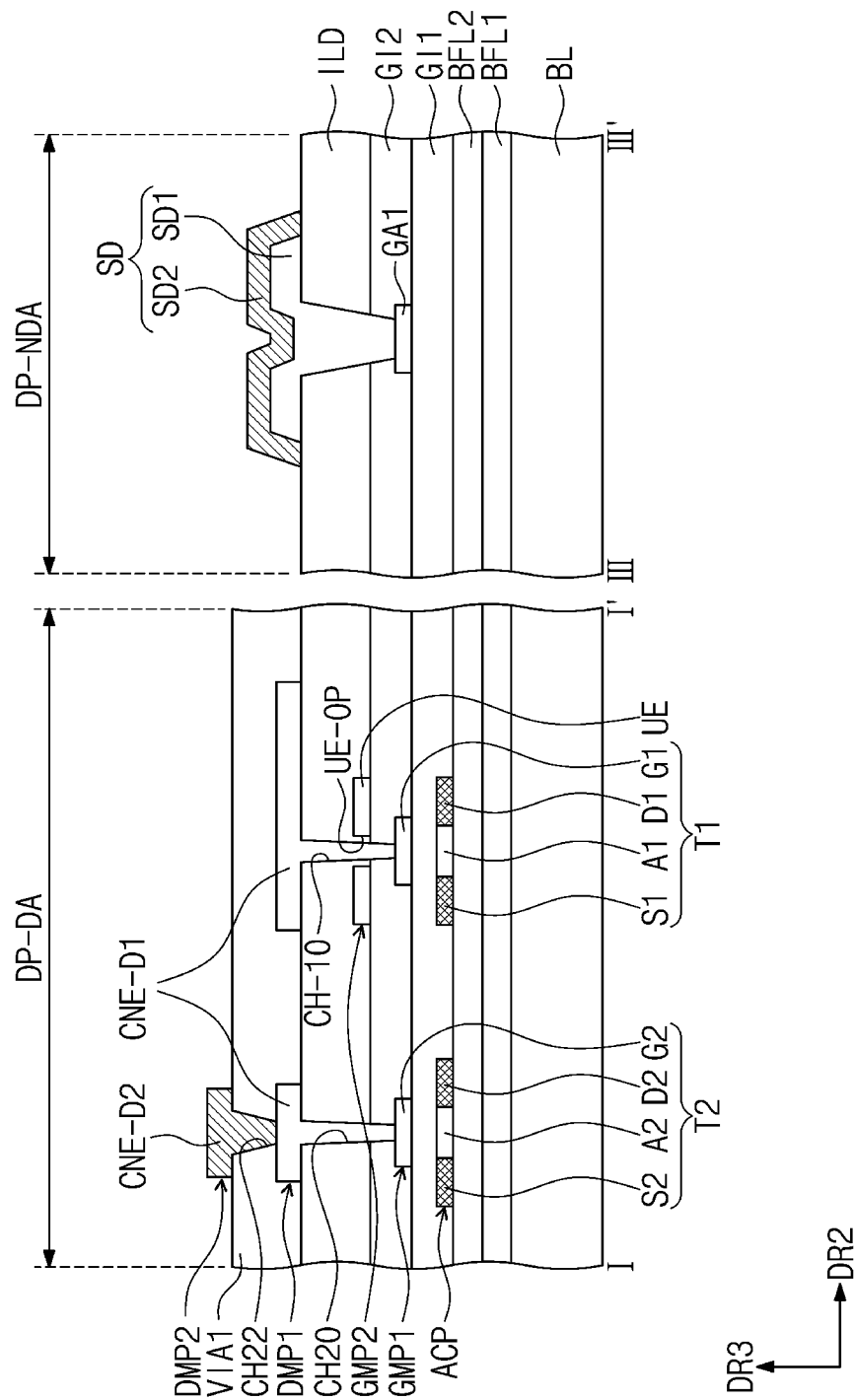
FIGS. 6A to 6I are cross-sectional views showing an embodiment of a method of manufacturing a display device.

FIG. 6A shows a cross-section taken along line I-I' of FIG. 4A and a cross-section taken along line of FIG. 5A.

Referring to FIG. 6A, the display panel DP may include the base layer BL, the buffer layers BFL1 and BFL2, the first gate insulating layer GI1, the second gate insulating layer GI2 and the first insulating layer ILD, which are each disposed in the display area DP-DA and the non-display area DP-NDA. In both the display area DP-DA and the non-display area DP-NDA, the buffer layers BFL1 and BFL2 may be disposed on the base layer BL, the first gate insulating layer GI1 may be disposed on the buffer layers BFL1 and BFL2, the second gate insulating layer GI2 may be disposed on the first gate insulating layer GI1, and the first insulating layer ILD may be disposed on the second gate insulating layer GI2.

In an embodiment, the first gate G1 and the second gate G2 of the display area DP-DA and the first gate pattern GA1 of the non-display area DP-NDA may be substantially simultaneously provided or formed. The first pad electrode SD1 and the first pixel electrode CNE-D1 may be substantially simultaneously provided or formed. As being simultaneously provided or formed, elements or patterns may be respective portions of a same material layer and/or may be considered "in a same layer" as each other.

The first pixel electrode CNE-D1 and the first pad electrode SD1 may be disposed on the first insulating layer ILD. In the display area DP-DA, the third insulating layer VIA1 may be disposed between the first pixel electrode CNE-D1 and the second pixel electrode CNE-D2, and the first pixel electrode CNE-D1 may be electrically connected to the second pixel electrode CNE-D2 at or through the connection contact hole CH22. In FIG. 6A, the second pixel electrode CNE-D2 and the second pad electrode SD2 may be exposed to outside the third insulating layer VIA1 and the first insulating layer ILD, respectively.

Figure 6B:
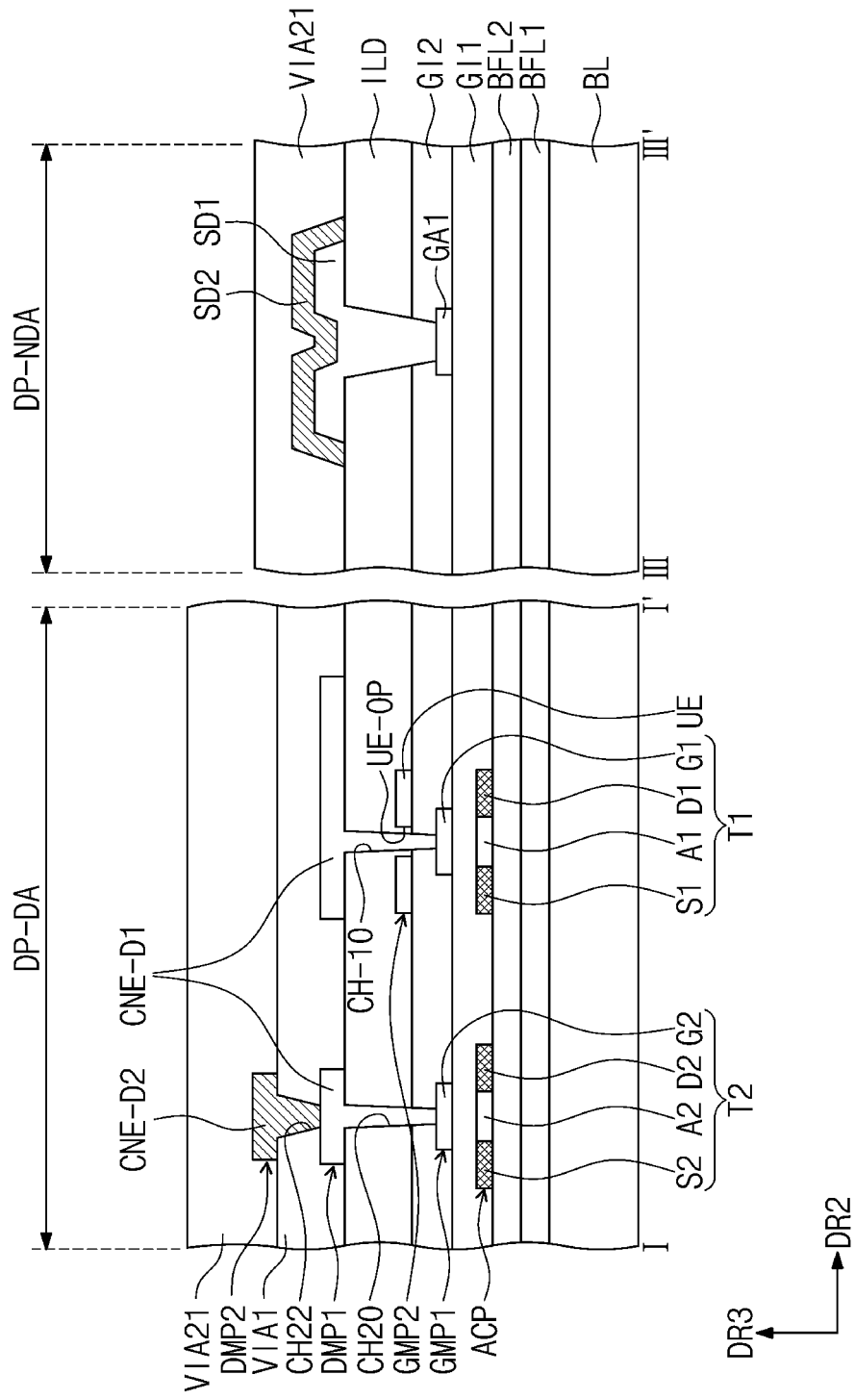

In FIG. 6B, a first organic layer VIA21 (e.g., first preliminary organic layer) may be provided or formed on the third insulating layer VIA1 of the display area DP-DA and the first insulating layer ILD of the non-display area DP-NDA. The first organic layer VIA21 may overlap the display area DP-DA and the non-display area DP-NDA and may cover an entirety of the second pixel electrode CNE-D2 and the second pad electrode SD2. That is, in the providing of the first organic layer VIA21 which is in the non-display area DP-NDA, the first organic layer VIA21 covers an entirety of the pad electrode SD.

In an embodiment, the first pad electrode SD1 and the second pad electrode SD2 may together form or have a multi-layer structure. The first pad electrode SD1 and/or the second pad electrode SD2 may include at least first, second and third metal layers ML1, ML2 and ML3 (refer to FIG. 6C). In an embodiment, for example, the first, second and third metal layers ML1, ML2, and ML3 may include a titanium layer, an aluminum layer and a titanium layer, respectively. The first and second pad electrodes SD1 and SD2 may each include at least one aluminum layer. That is, at least one of the first metal layer ML1, the second metal layer ML2 and the third metal layer ML3 includes aluminum, and a remaining one of the first metal layer ML1, the second metal layer ML2 and the third metal layer ML3 includes titanium. The pad electrode SD includes a side surface, and in the pad area NDA-PA, a portion of each of the first metal layer ML1, the second metal layer ML2 and the third metal layer ML3 is exposed to outside the pad electrode SD at the side surface.

An embodiment of a method of providing or forming the anode layer AEL will be described with reference to FIGS. 6C to 6E.

Figure 6C:
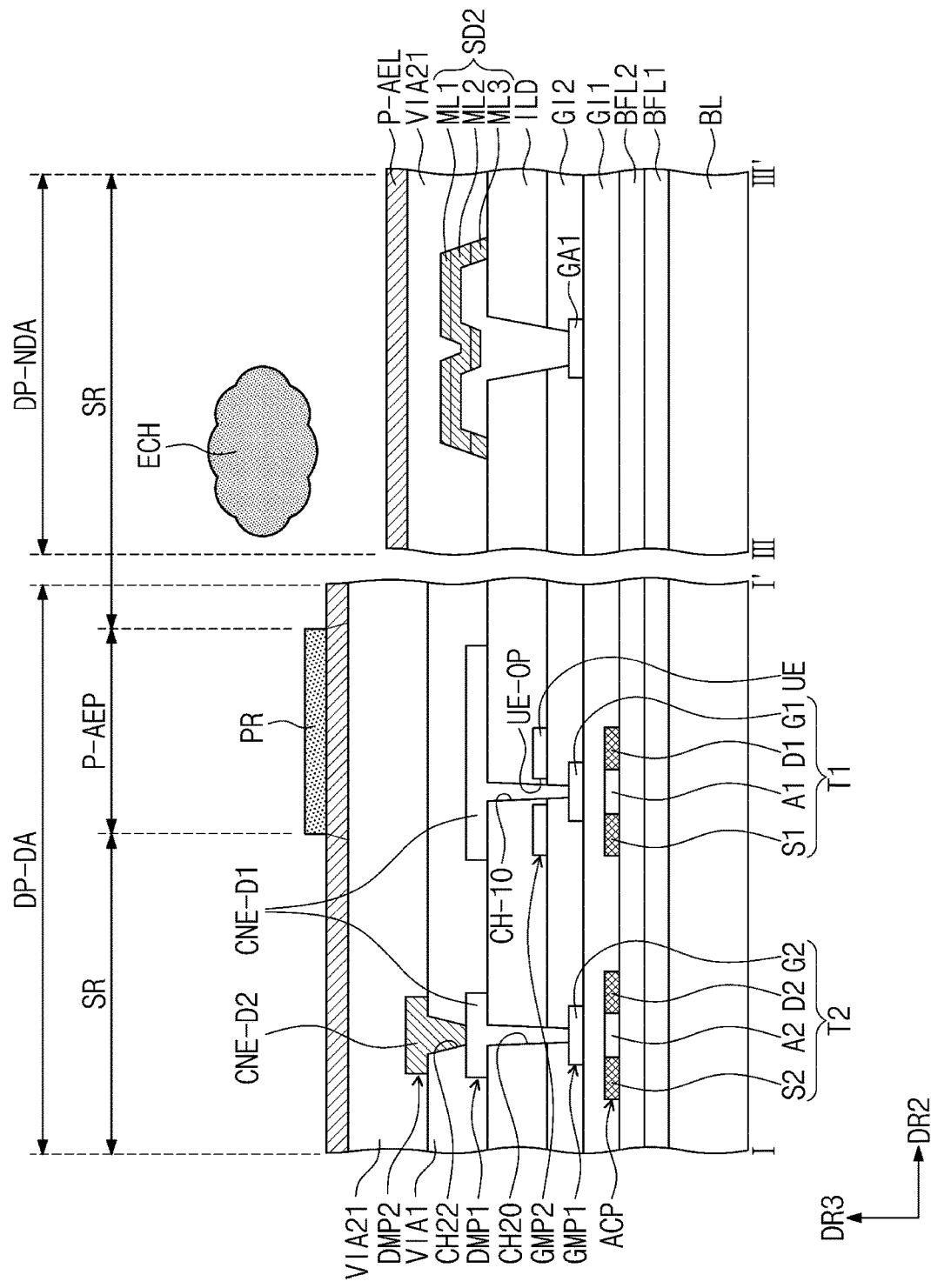
Figure 6D:
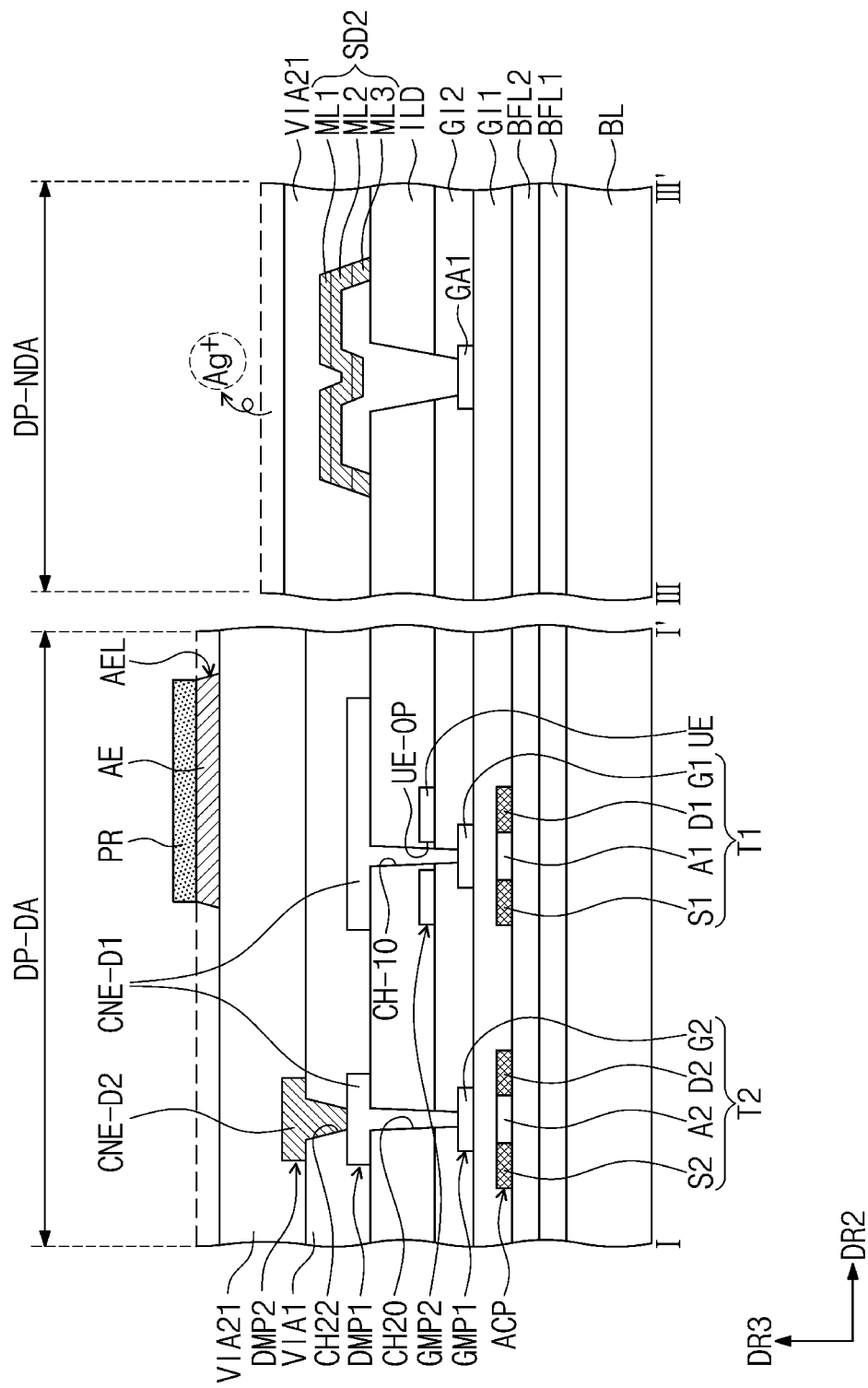
Figure 6E:
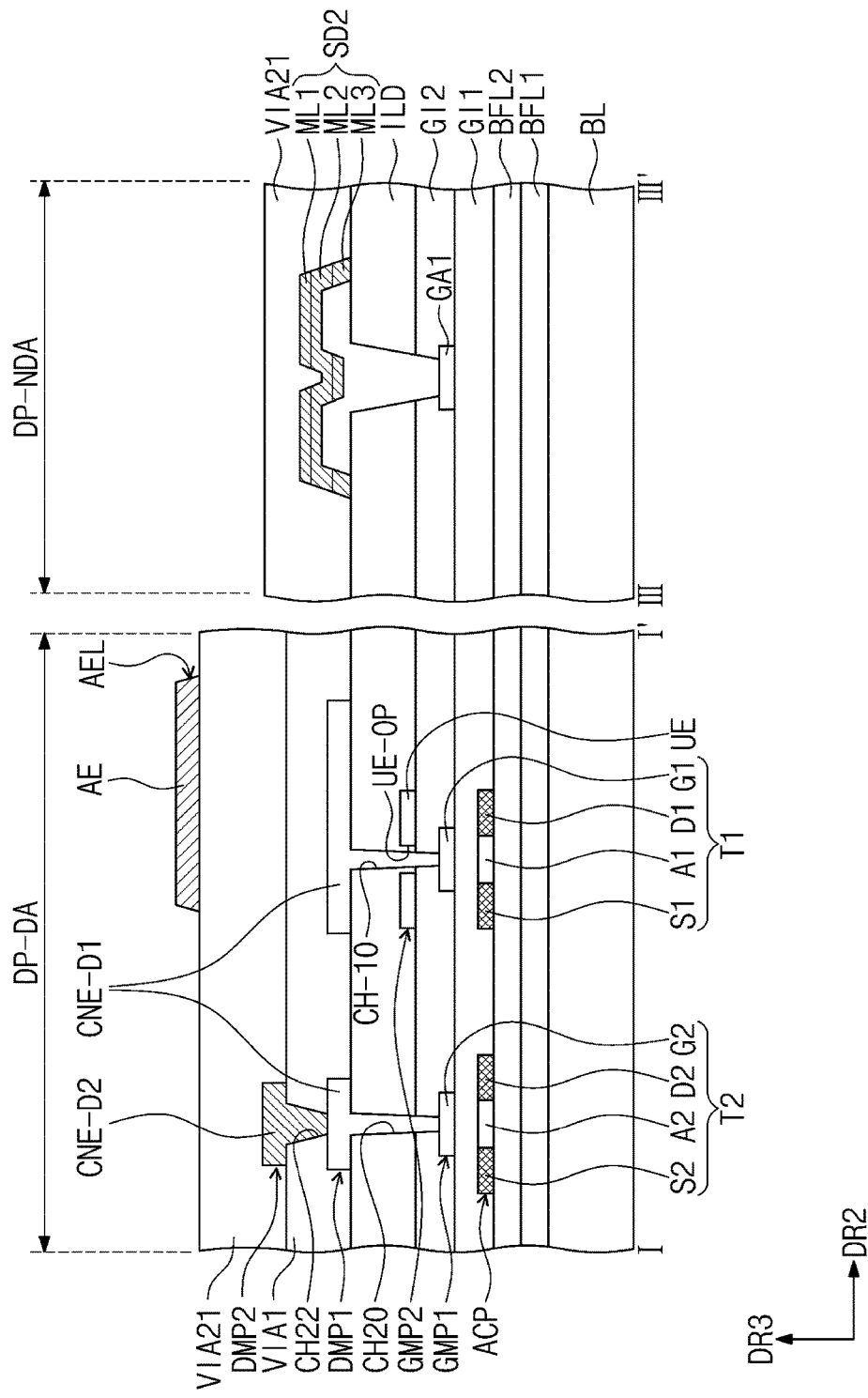

In FIGS. 6C to 6E, a preliminary anode layer P-AEL (e.g., preliminary first electrode layer) may be provided or formed on the first organic layer VIA21, which provides or forms the anode layer AEL. The preliminary anode layer P-AEL may include an anode electrode portion P-AEP (e.g., first electrode portion) and a peripheral portion SR. In an embodiment, the anode electrode AE may be provided or formed through a wet etching process. Various components or layers on the base layer BL may also include an anode electrode portion P-AEP and a peripheral portion SR corresponding to those described for the preliminary anode layer P-AEL.

When the preliminary anode layer P-AEL is in contact with an etchant ECH during the wet etching process, the contact portion (e.g., the peripheral portion SR) of the preliminary anode layer P-AEL may be etched, and silver of the preliminary anode layer P-AEL may be ionized to discharge silver ions (Ag$^+$) in the wet etching process. The discharged silver ions may undergo a galvanic reaction with aluminum (Al) of the aluminum layer among the metal layers ML1, ML2 and ML3 of the second pad electrode SD2, and a defect in which silver particles Ag P/C are precipitated around the pad electrode SD may occur. One or more embodiment is disclosed to reduce or effectively prevent this defect.

According to an embodiment, a process of providing or forming the anode layer AEL may be performed after the pixel electrode and the pad electrode SD are covered by the first organic layer VIA21. Different from a conventional art in which the process of forming the anode electrode AE is performed while the pad electrodes SD is exposed, in one or more embodiment of the manufacturing method of the display device DD, the process of forming the anode electrode AE may be performed with the pad electrodes SD entirely covered by the first organic layer VIA21. Since the aluminum layer of the pad electrodes SD is not exposed e.g., covered by the first organic layer VIA21, the silver ions discharged (Ag+ in FIG. 6D) when the preliminary anode layer P-AEL is etched by the etchant ECH may not cause the galvanic reaction around the pad electrode SD. Accordingly, the above-mentioned defect may be improved.

In FIGS. 6C and 6D, the process of providing or forming the anode layer AEL may include a process of providing forming a photoresist layer PR (e.g., photoresist pattern) on the preliminary anode layer P-AEL. An embodiment of a process of providing or forming the photoresist layer PR includes a first photoresist layer (not shown) covering both the anode electrode portion P-AEP and the peripheral portion SR of the preliminary anode layer P-AEL, and etching by an exposure and development process, a portion of the first photoresist layer PR which overlaps the peripheral portion SR. As a result, only the photoresist layer PR at the anode electrode portion P-AEP may remain as a photoresist pattern.

The photoresist layer PR may cover only the anode electrode portion P-AEP, and other layers at the peripheral portion SR may be exposed without being covered by the photoresist layer PR (FIG. 6C). When the wet etching process is performed to etch the peripheral portion SR of the preliminary anode layer P-AEL which is exposed, by using the photoresist pattern as a mask, only the anode electrode portion P-AEP of the preliminary anode layer P-AEL and the photoresist layer PR which is disposed on the anode electrode portion P-AEP may remain (FIG. 6D). The anode electrode portion P-AEP of the preliminary anode layer P-AEL defines the anode layer AEL (FIG. 6D). The anode electrode AE (FIG. 4B) is defined by the anode layer AEL (e.g., anode layer pattern).

In FIG. 6E, when the photoresist layer PR is removed and the anode layer AEL is exposed, the anode electrode AE may be provided or formed by the anode layer AEL which is exposed. The pad electrodes SD may be covered by the first organic layer VIA21 during the wet etching process which is performed to finally provide or form the anode electrode AE (FIG. 4B).

Figure 6F:
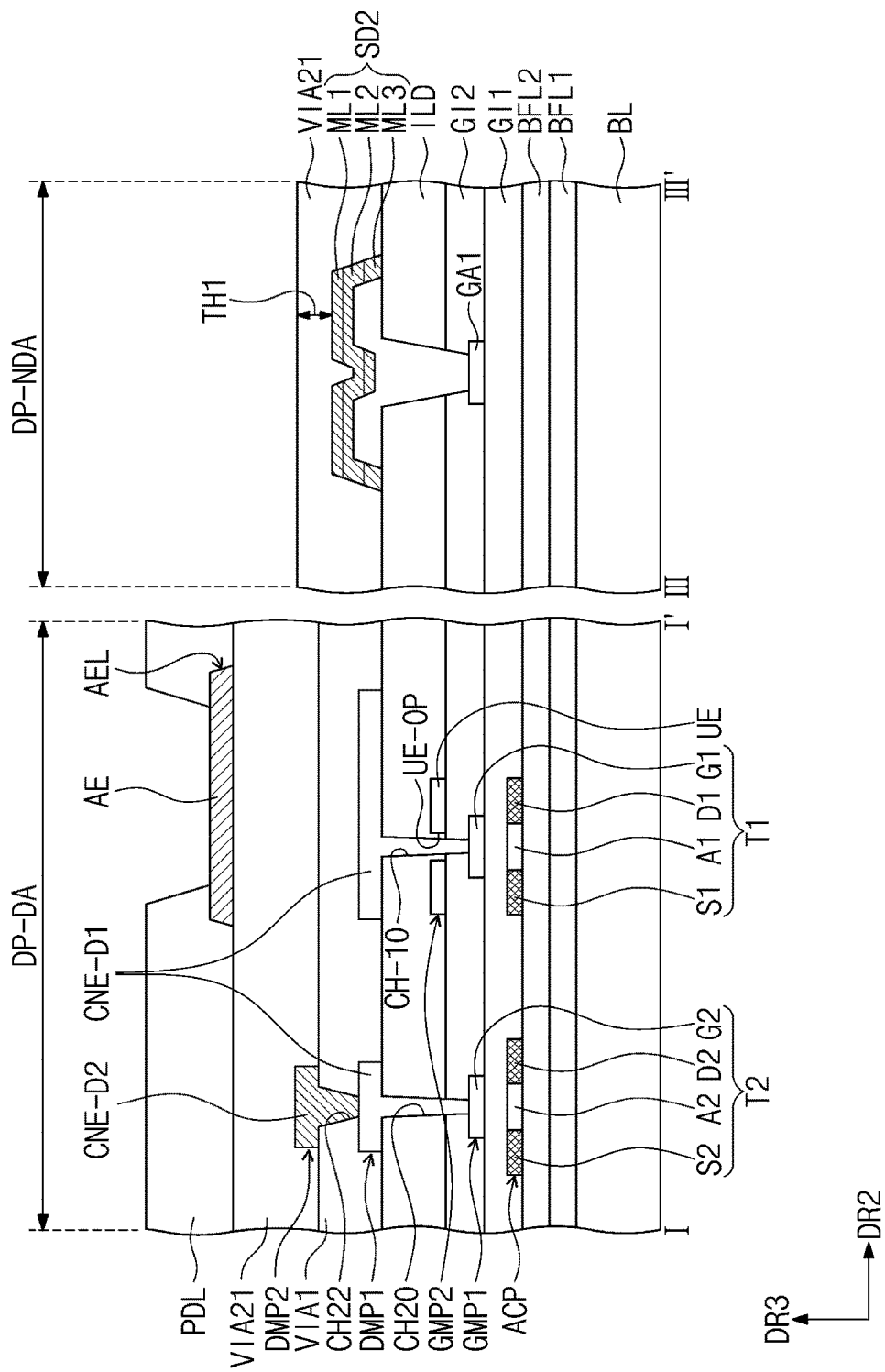
Figure 6G:
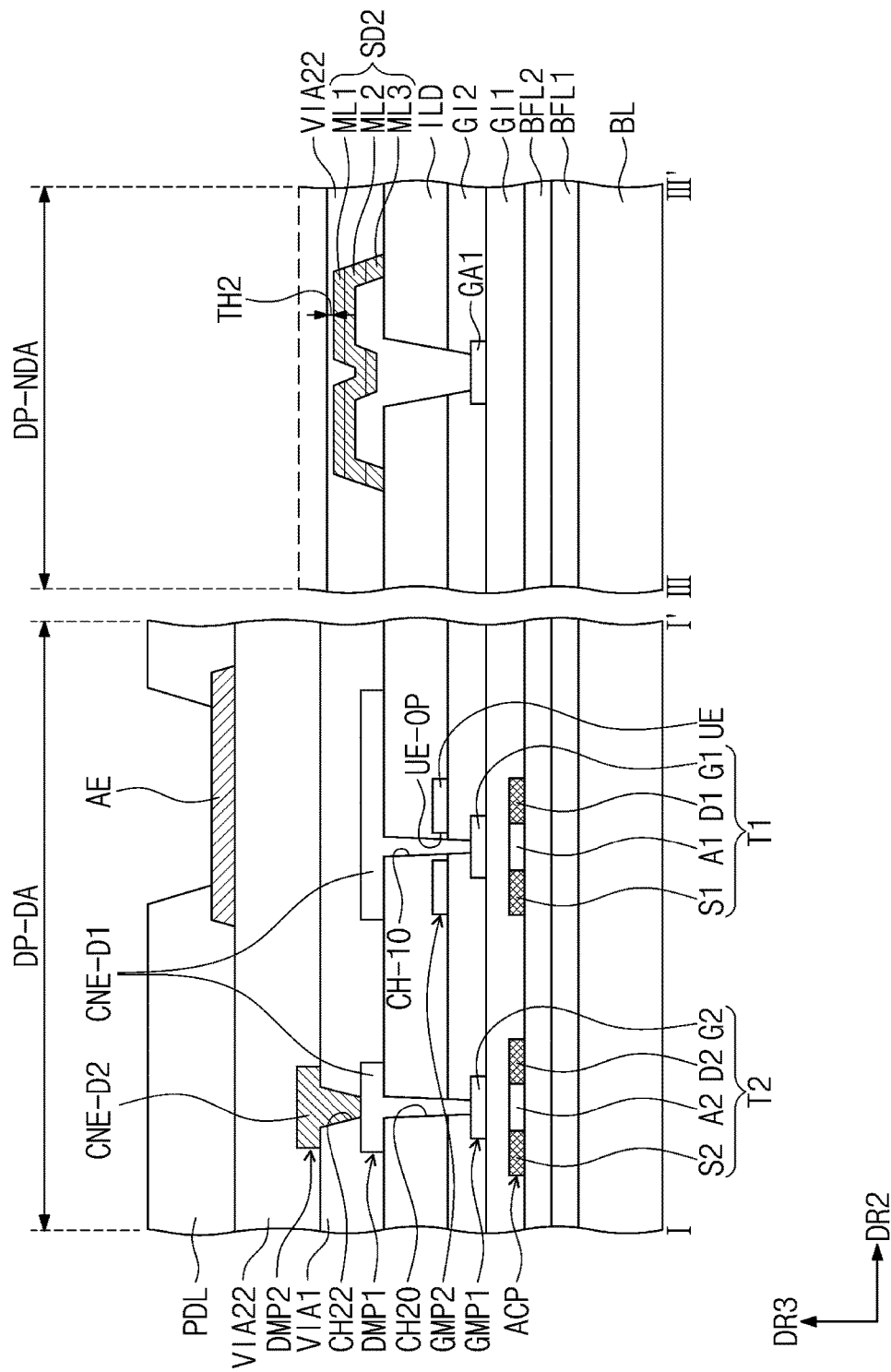
Figure 6H:
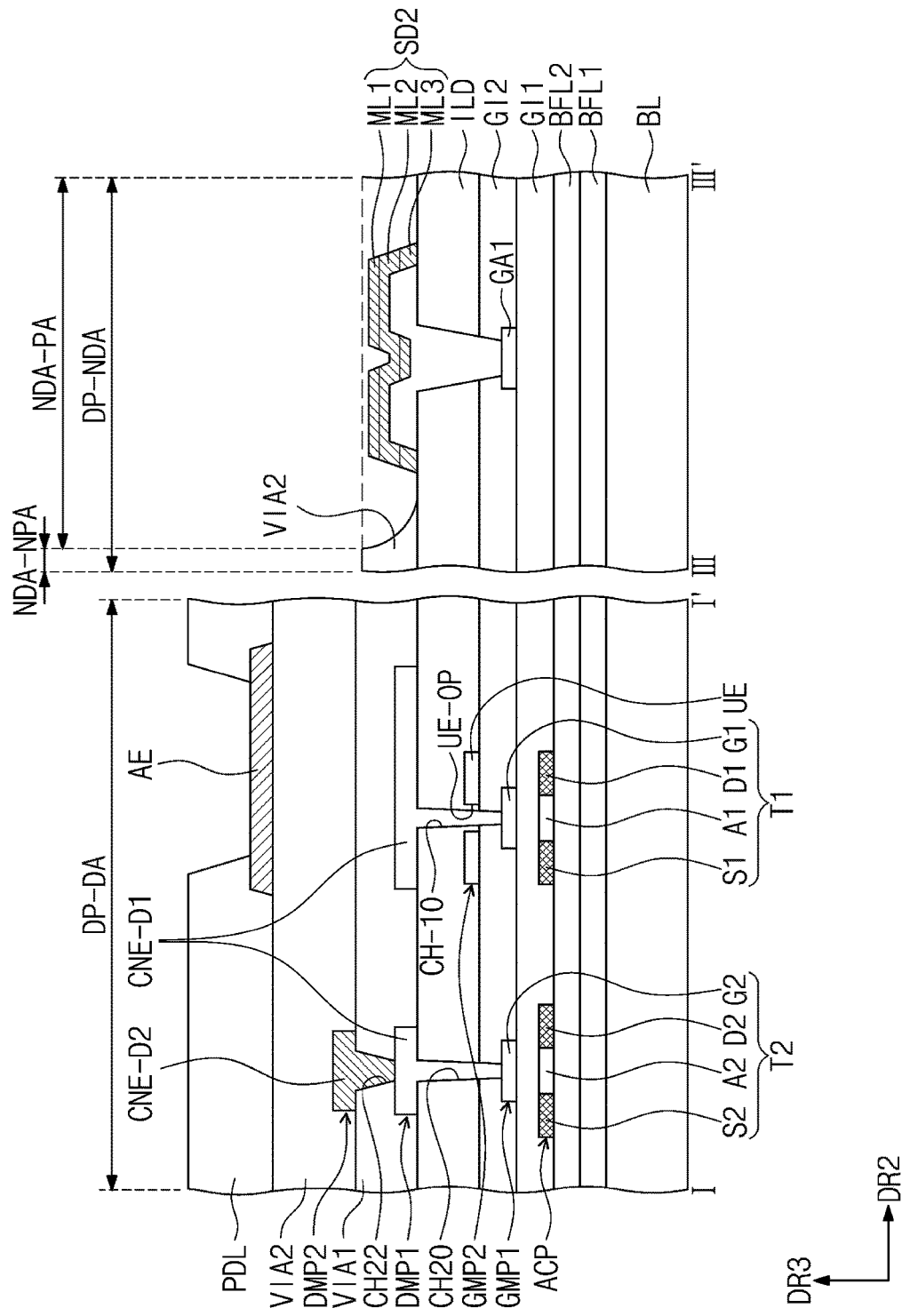

Referring to FIGS. 6F to 6H, a portion of the first organic layer VIA21 covering the pad electrodes SD may be removed after the anode layer AEL is provided or formed. Hereinafter, this process will be described with reference to the figures.

In FIG. 6F, the planarization layer PDL through which a second opening is defined to expose at least a portion of the anode electrode AE defined by the anode layer AEL, may be provided or formed on the anode layer AEL. The planarization layer PDL may correspond to the pixel definition layer. The planarization layer PDL may be disposed to define the pixel PX.

Referring to FIGS. 6G and 6H, a process of etching may be performed to remove a thickness portion of the first organic layer VIA21, after the planarization layer PDL is provided or formed. The etching process may correspond to a dry etching process. As described above with respect to FIGS. 4A to 5B, the pad electrode SD are exposed to outside the display panel DP for connection to other electronic components in a subsequent module process. When the pad electrode SD is covered by an organic material layer or the like, an adhesive strength between elements may be poor, and performing the module process may be difficult or limited. Accordingly, one or more embodiment of the manufacturing method of the display device DD may include the etching process to remove a portion the first organic layer VIA21 that covers the pad electrode SD, in the pad area NDA-PA. In an embodiment, the etching process to remove the thickness portion of the first organic layer VIA21 may be performed after the process of providing or forming the planarization layer PDL of FIG. 6F, and before the module process in which external components are connected to the display panel DP at the pad electrode SD.

The etching process to remove the thickness portion of the first organic layer VIA21 may be performed using another etching process that is indispensably performed in the manufacturing method of the display device DD without being limited by a separately added process. In an embodiment, for example, the first organic layer VIA21 in the pad area NDA-PA in the non-display area DP-NDA may be removed by a dry etching process included in simultaneous processes of providing or forming a component hole or module hole in a hole in active area ("HIAA") structure. The HIAA structure includes a component or a module hole defined in the display area DP-DA to expose a camera module or the like to outside the display panel DP and/or display device DD.

According to an embodiment, the etching process to remove the thickness portion of the first organic layer VIA21 may include a first etching process and a second etching process. In the first etching process, the dry etching process may be performed on the first organic layer VIA21 to form a second organic layer VIA22 (e.g., second preliminary organic layer). In the second etching process, the dry etching process may be performed again on the second organic layer VIA22 to form a third organic layer. The third organic layer may define the second insulating layer VIA2 of FIG. 5B. A first thickness portion at an upper portion of the first organic layer VIA21 may be removed in the first etching process. A second thickness portion of the second organic layer VIA22, which overlaps the pad area NDA-PA, may be removed in the second etching process to expose the pad electrodes SD to outside the second insulating layer VIA2. The second insulating layer VIA2 may overlap a portion of the edge (e.g., boundary) of the pad area NDA-PA and may be disposed to surround the pad area NDA-PA.

In FIGS. 6F and 6G, the first organic layer VIA21 may have a first thickness TH1 greater than a second thickness TH2 of the second organic layer VIA22. In an embodiment, for example, the first thickness TH1 of the first organic layer VIA21 may be within a range from about 1.5 micrometers to about 2.0 micrometers, and the second thickness TH2 of the second organic layer VIA22 may be within a range from about 0.8 micrometers to about 1.2 micrometers. The second organic layer VIA22 may be disposed in the non-display area DP-NDA.

Figure 6I:
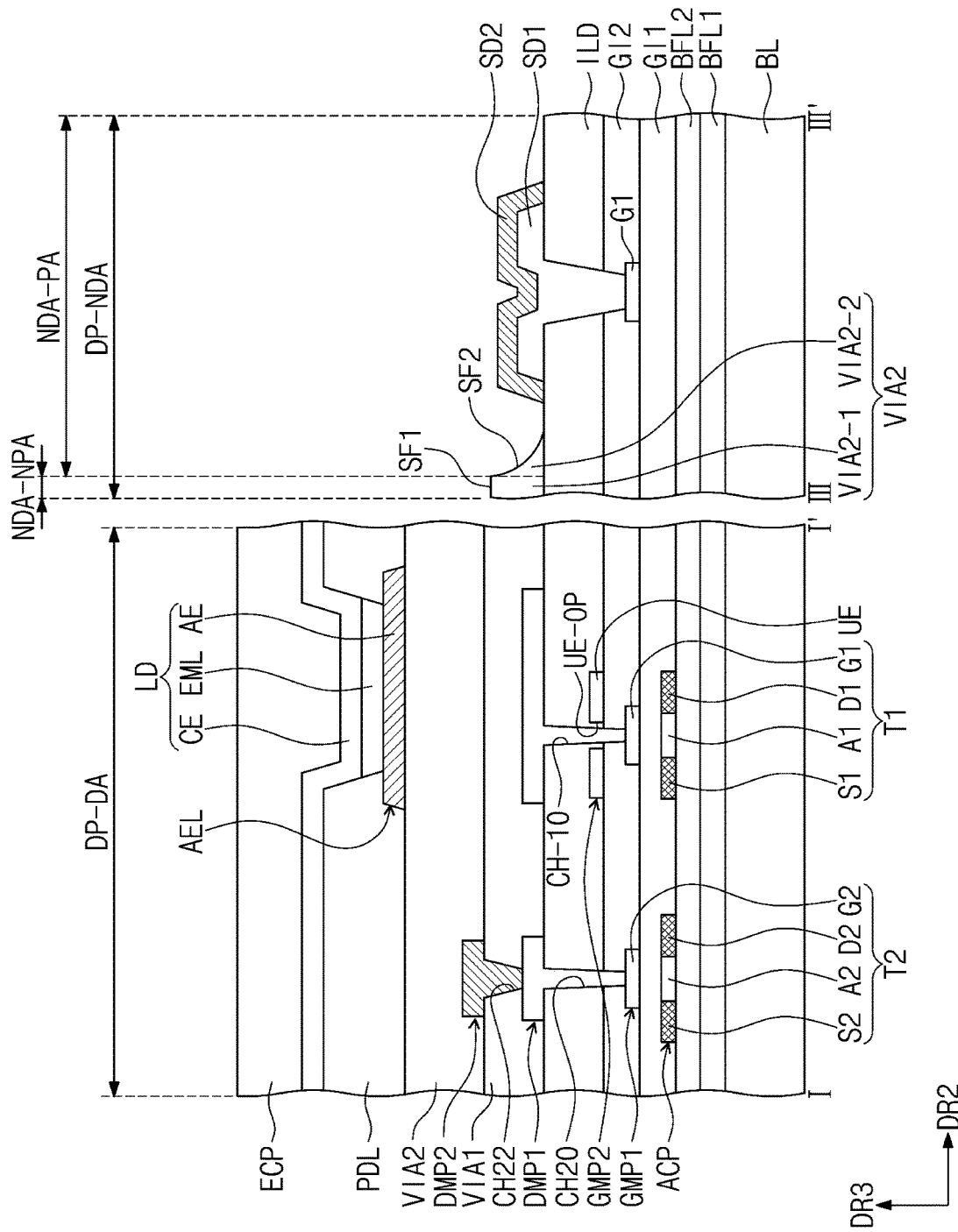

Referring to FIGS. 6H and 6I, the second insulating layer VIA2 may include the first portion VIA2-1 (FIG. 5B) overlapping the non-pad area NDA-NPA of the non-display area DP-NDA and the second portion VIA2-2 (FIG. 5B) overlapping a portion of the pad area NDA-PA of the non-display area DP-NDA. The first portion VIA2-1 may correspond to a portion generated through the first etching process applied to the first organic layer VIA21, and the second portion VIA2-2 may correspond to a portion generated through the second etching process which is applied to the second organic layer VIA22 after the first etching process.

The second portion VIA2-2 may include the second surface SF2 (FIG. 5B) extending from the first surface SF1 of the first portion VIA2-1 to the pad electrode SD and may be in contact with the upper surface of the insulating layer ILD. The second surface SF2 may correspond to an inclined plane of the second portion VIA2-2. According to an embodiment, the second surface SF2 may be a curved surface that is concaved along the thickness direction of the insulating layer ILD. That is, the second surface SF2 of the second portion VIA2-2, which corresponds to an end or edge of the second insulating layer VIA2 remaining after etching the second insulating layer VIA2 formed through two dry etching processes in the pad area NDA-PA, may have the curved shape that is concaved along the thickness direction of the insulating layer ILD. The end or edge of the second insulating layer VIA2 which defines the second surface SF2 is furthest from the display area DP-DA or closest to the pad area NDA-PA.

Referring to FIG. 6I, the light emitting layer EML may be provided or formed on the planarization layer PDL to overlap the display area DP-DA. In an embodiment, the cathode electrode CE may be provided or formed above the light emitting layer EML. The light emitting layer EML, the anode electrode AE and the cathode electrode CE together may define the light emitting element LD. The second insulating layer VIA2 may correspond to the second insulating layer VIA2 of FIG. 5B.

According to another embodiment, the second insulating layer VIA2 may be provided or formed from the first organic layer VIA21 after the process of forming the light emitting layer EML. That is, after the planarization layer PDL is provided (FIG. 6F), the light emitting layer EML may be disposed in the second opening of the planarization layer PDL, while the first organic layer VIA21 has the first thickness TH1. The first and second etching processes (FIGS. 6F to 6H) may be performed on the structure of FIG. 6F further having the light emitting layer EML in the second opening, to provide the structure in FIG. 6I.

Although embodiments have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the invention shall be determined according to the attached claims.

What is claimed is:
1. A display device comprising:
 a display panel comprising:
  a display area and a non-display area which is adjacent to the display area;
  the non-display area including a pad area through which an electrical signal is provided to the display panel from outside thereof and a non-pad area which is between the display area and the pad area:
  a base layer in each of the display area, the non-pad area and the pad area;
  a first insulating layer on the base layer;
  a pixel electrode in the display area, the pixel electrode facing the base layer with the first insulating layer therebetween;
  a pad electrode in the pad area, the pad electrode facing the base layer with the first insulating layer therebetween;
  a second insulating layer in the display area and facing the first insulating layer with the pixel electrode therebetween, the second insulating layer extending from the display area and into the non-display area to define:
   a first portion corresponding to the non-pad area, and
   a second portion extending from the first portion, toward the pad electrode and into the pad area, the second portion defining an upper surface which is furthest from the first insulating layer, wherein the upper surface has a concave shape in cross-section; and in the display area, a first electrode of a light emitting element, the first electrode facing the first insulating layer with the second insulating layer therebetween.

2. The display device of claim 1, wherein each of the first portion and the second portion of the second insulating layer has a thickness, and the thickness of the second portion of the second insulating layer is smaller than the first portion of the second insulating layer.

3. The display device of claim 1, wherein in the display area, the pixel electrode is covered by the second insulating layer, and in the pad area, the pad electrode is exposed outside of the second insulating layer.

4. The display device of claim 1, wherein the pixel electrode in the display area comprises:

a first pixel electrode; and a second pixel electrode between the first pixel electrode and the second insulating layer, further comprising a third insulating layer between the first pixel electrode and the second pixel electrode.

5. The display device of claim 1, wherein the pad electrode in the pad area comprises:

a side surface;

a first pad electrode; and a second pad electrode which covers the first pad electrode.

6. The display device of claim 5, wherein in the pad area, the second pad electrode comprises:

a first metal layer;

a second metal layer on the first metal layer; and a third metal layer facing the first metal layer with the second metal layer therebetween, wherein each of the first metal layer, the second metal layer and the third metal layer is exposed to outside the pad electrode, at the side surface of the pad electrode.

7. The display device of claim 6, wherein at least one of the first metal layer, the second metal layer and the third metal layer includes aluminum, and a remaining one of the first metal layer, the second metal layer and the third metal layer includes titanium.

* * * * *